(12) United States Patent
Bai et al.

(10) Patent No.: US 10,324,553 B2
(45) Date of Patent: Jun. 18, 2019

(54) ARRAY SUBSTRATE AND FABRICATION METHOD THEREOF, OPTICAL TOUCH SCREEN, AND DISPLAY DEVICE

(71) Applicants: Boe Technology Group Co., Ltd., Beijing (CN); Beijing Boe Display Technology Co., Ltd., Beijing (CN)

(72) Inventors: Jinchao Bai, Beijing (CN); Tsungchieh Kuo, Beijing (CN); Xiangqian Ding, Beijing (CN); Yao Liu, Beijing (CN); Xiaowei Liu, Beijing (CN); Xi Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 72 days.

(21) Appl. No.: 15/327,767

(22) PCT Filed: Mar. 24, 2016

(86) PCT No.: PCT/CN2016/077219
§ 371 (c)(1),
(2) Date: Jan. 20, 2017

(87) PCT Pub. No.: WO2016/180092
PCT Pub. Date: Nov. 17, 2016

(65) Prior Publication Data
US 2017/0212621 A1    Jul. 27, 2017

(30) Foreign Application Priority Data
May 12, 2015  (CN) .......................... 2015 1 0239499

(51) Int. Cl.
*G06F 3/041* (2006.01)
*G06F 3/042* (2006.01)
*G02F 1/1333* (2006.01)
*G02F 1/1362* (2006.01)
(Continued)

(52) U.S. Cl.
CPC .......... *G06F 3/0412* (2013.01); *G02F 1/1368* (2013.01); *G02F 1/13338* (2013.01);
(Continued)

(58) Field of Classification Search
CPC ...... G06F 3/041; G06F 3/0412; G06F 3/0416; G06F 3/042; G06F 3/0421; G06F 3/048;
(Continued)

(56) References Cited

U.S. PATENT DOCUMENTS 9,412,760 B1 *  8/2016  Bai ........................ H01L 27/124
9,710,089 B2 *  7/2017  Chen ........................ G06F 3/041
(Continued)

FOREIGN PATENT DOCUMENTS

CN  103019476       4/2013
CN  103019476 A     4/2013
(Continued)

OTHER PUBLICATIONS

International Search Report for PCT/CN2016/077219 dated Jul. 7, 2016.
(Continued)

*Primary Examiner* — Alexander Eisen
*Assistant Examiner* — Nelson Lam
(74) *Attorney, Agent, or Firm* — Calfee, Halter & Griswold LLP

(57) ABSTRACT

Disclosed is an array substrate including a base substrate and a gate metal layer, a semiconductor layer, a source-drain metal layer, and a pixel electrode layer that are formed on the base substrate. The gate metal layer includes gate lines, gate electrodes of thin film transistors, and a plurality of first sensing lines extending along a row direction. The semiconductor layer includes an active layer of the thin film transistors, and a plurality of first photosensitive elements and a plurality of second photosensitive elements that are
(Continued)

insulated from each other. The source-drain metal layer includes data lines, source electrodes and drain electrodes of the thin film transistors, and a plurality of second sensing lines extending along a column direction. Also disclosed are a method of fabricating the array substrate, an optical touch screen and a display device.

15 Claims, 4 Drawing Sheets

(51) Int. Cl.
    *G02F 1/1368*     (2006.01)
    *H01L 27/144*     (2006.01)

(52) U.S. Cl.
    CPC .. *G02F 1/136209* (2013.01); *G02F 1/136227* (2013.01); *G02F 1/136286* (2013.01); *G06F 3/042* (2013.01); *G06F 3/0421* (2013.01); *H01L 27/1446* (2013.01); *G02F 2001/136218* (2013.01); *G02F 2001/136236* (2013.01); *G02F 2001/136295* (2013.01); *G06F 2203/04103* (2013.01); *G06F 2203/04107* (2013.01)

(58) Field of Classification Search
    CPC ..... G06F 2203/04107; G02F 1/136209; G02F 2001/136218
    USPC .................................. 345/87–104, 173–179
    See application file for complete search history.

(56) References Cited

U.S. PATENT DOCUMENTS

| | | | |
|---|---|---|---|
| 10,014,329 B2 * | 7/2018 | Bai | ............ H01L 27/1248 |
| 10,197,817 B2 * | 2/2019 | Bai | .............. G02F 1/1335 |
| 2005/0219442 A1 | 10/2005 | Yang et al. | |
| 2008/0186434 A1 * | 8/2008 | Yun | ................ G02F 1/1362 349/106 |
| 2008/0246905 A1 * | 10/2008 | Chen | ............... G02F 1/13338 349/106 |
| 2008/0278667 A1 * | 11/2008 | Kobashi | ............. G02F 1/13318 349/116 |
| 2010/0066703 A1 * | 3/2010 | Chen | .................. G06F 3/0412 345/175 |
| 2010/0156850 A1 * | 6/2010 | Kurokawa | ........... G02F 1/13338 345/175 |
| 2010/0220069 A1 * | 9/2010 | Choi | ....................... G01J 1/02 345/173 |
| 2015/0185930 A1 | 7/2015 | Xu | |
| 2018/0019288 A1 * | 1/2018 | Yang | ................... G06F 3/0412 |
| 2019/0004660 A1 * | 1/2019 | Guo | ..................... G06F 3/0414 |
| 2019/0011742 A1 * | 1/2019 | Park | ..................... G02F 1/1368 |

FOREIGN PATENT DOCUMENTS

| | | |
|---|---|---|
| CN | 103713778 | 4/2014 |
| CN | 103713778 A | 4/2014 |
| CN | 103728760 | 4/2014 |
| CN | 103728760 A | 4/2014 |
| CN | 104898896 | 9/2015 |

OTHER PUBLICATIONS

First Office Action from Chinese Application No. 201510239499.6 dated Jun. 1, 2016.
Second Office Action from Chinese Application No. 201510239499.6 dated Nov. 6, 2017.

* cited by examiner

ARRAY SUBSTRATE AND FABRICATION METHOD THEREOF, OPTICAL TOUCH SCREEN, AND DISPLAY DEVICE

RELATED APPLICATIONS

The present application is the U.S. national phase entry of PCT/CN2016/077219, with an international filing date of Mar. 24, 2016, which claims the benefit of Chinese Patent Application No. 201510239499.6, filed on May 12, 2015, the entire disclosures of which are incorporated herein by reference.

TECHNICAL FIELD

The present disclosure relates to the field of touch screen technologies, and particularly to an array substrate and fabrication method thereof, an optical touch screen, and a display device.

BACKGROUND

With the development of the display technologies, touch screens have found wide application. Currently, depending on their working principles, the touch screens can be categorized into resistive-sensing touch screens, capacitive-sensing touch screens, optical-sensing touch screens, and so forth. In accordance with their structures, the touch screens can be classified into on-cell touch screens, in-cell touch screens, and so on. The in-cell touch screens have an advantage of a thinned thickness and reduced cost.

Existing optical touch screen technology provides a touch sensing mechanism that is based on detection of ambient light. For example, photosensitive transistors are integrated in the pixels of a liquid crystal display panel to detect the external ambient light. As the photosensitive transistors are embedded in the array substrate of the liquid crystal display panel, an in-cell optical touch screen is implemented. This in-cell optical touch screen typically requires complicated fabricate processes.

SUMMARY

It would be advantageous to provide an array substrate including photosensitive elements and sensing lines that are formed in existing layers of the array substrate. It would also be desirable to provide a method of fabricating the array substrate, an optical touch screen including the array substrate, and a display device including the optical touch screen.

According to an aspect of the present disclosure, an array substrate is provided including a base substrate, and a gate metal layer, a semiconductor layer, a source-drain metal layer, and a pixel electrode layer that are formed on the base substrate. The gate metal layer includes gate lines, gate electrodes of thin film transistors, and a plurality of first sensing lines extending along a row direction. The semiconductor layer includes an active layer of the thin film transistors, and a plurality of first photosensitive elements and a plurality of second photosensitive elements insulated from each other. The source-drain metal layer includes data lines, source electrodes and drain electrodes of the thin film transistors, and a plurality of second sensing lines extending along a column direction. The plurality of first photosensitive elements are arranged in an array and the first photosensitive elements of the same row are electrically connected to a corresponding one of the plurality of first sensing lines. Each of the plurality of first photosensitive elements is configured to generate a current signal responsive to ambient light, and each of the plurality of first sensing lines is configure to transfer current signals generated by a corresponding row of first photosensitive elements. The plurality of second photosensitive elements are arranged in an array and the second photosensitive elements of the same column are electrically connected to a corresponding one of the plurality of second sensing lines. Each of the plurality of second photosensitive elements is configured to generate a current signal responsive to ambient light, and each of the plurality of second sensing lines is configure to transfer the current signal generated by a corresponding column of second photosensitive elements.

In some embodiments, the array substrate further includes a plurality of connection electrodes formed in the pixel electrode layer. Each of the connection electrodes provides electrical connection between a corresponding one of the plurality of first sensing lines and a corresponding one of the plurality of first photosensitive elements.

In some embodiments, the array substrate further includes a plurality of transition electrodes formed in the source-drain metal layer. Each of the transition electrodes connects a respective one of the plurality of connection electrodes to a respective one of the plurality of first photosensitive elements.

In some embodiments, the plurality of first sensing lines are parallel to the gate lines, and wherein the plurality of second sensing lines are parallel to the data lines.

In some embodiments, the gate lines and the data lines intersect each other to define a plurality of pixel units. The plurality of first photosensitive elements and the plurality of second photosensitive elements are divided into a plurality of photosensitive element groups each including a respective one of the first photosensitive elements and a respective one of the second photosensitive elements, and each of the photosensitive element groups corresponds to one or more pixel units.

In some embodiments, the gate metal layer further includes a plurality of shielding electrodes each located under a respective one of the plurality of second photosensitive elements to shield the respective second photosensitive element from illumination by backlight.

In some embodiments, the plurality of first sensing lines are each provided with an extension part for shielding a respective one of the plurality of first photosensitive elements from illumination by backlight.

In some embodiments, the extension part is an extended section of the first sensing line in a width direction thereof.

In some embodiments, the semiconductor layer includes a plurality of parts on which the data lines are formed.

In some embodiments, the plurality of first photosensitive elements and the plurality of second photosensitive elements are formed by noncrystalline silicon material.

According to another aspect of the present disclosure, an optical touch screen is provided including the array substrate as recited above.

In some embodiments, the optical touch screen further includes a color filter substrate comprising black matrice. When viewed from a thickness direction of the optical touch screen the black matrice do not overlap the plurality of first photosensitive elements and the plurality of second photosensitive elements.

According to still another aspect of the present disclosure, a display device is provided including the touch screen as recited above.

According to yet another aspect of the present disclosure, a method of fabricating an array substrate is provided including forming a gate metal thin film on a base substrate; forming a gate metal layer comprising a gate line, a gate electrode of a thin film transistor, a first sensing line, and a shielding electrode by patterning the gate metal thin film; forming successively a gate insulation layer, a semiconductor thin film and a source-drain metal thin film above the gate metal layer; applying photo-resist on the source-drain metal thin film; conducting exposure and development using a half-tone mask; forming a source-drain metal layer comprising a data line, a source electrode and a drain electrode of the thin film transistor, a second sensing line extending along a column direction, and a transition electrode by etching the source-drain metal thin film; forming a semiconductor layer comprising an active layer of the thin film transistor, a first photosensitive element and a second photosensitive element by etching the semiconductor thin film, such that the first photosensitive element is located under and in contact with the transition electrode, and the second photosensitive element is located under and in contact with the second sensing line; forming a passivation layer above the source-drain metal layer; forming a first via extending from the passivation layer to the transition electrode and a second via extending from the passivation layer to the first sensing line such that the transition electrode and the first sensing line are exposed; forming a pixel electrode thin film above the passivation layer; and forming a pixel electrode layer comprising a pixel electrode and a connection electrode by patterning the pixel electrode thin film.

In some embodiments, the method further includes connecting the transition electrode to the first sensing line using the connection electrode.

According to embodiments of the disclosure, the first photosensitive elements, the second photosensitive elements, the first sensing lines, and the second sensing lines are formed in existing layers of the array substrate, thus facilitating simplification of the fabricate process.

DETAILED DESCRIPTION

Figure 1:
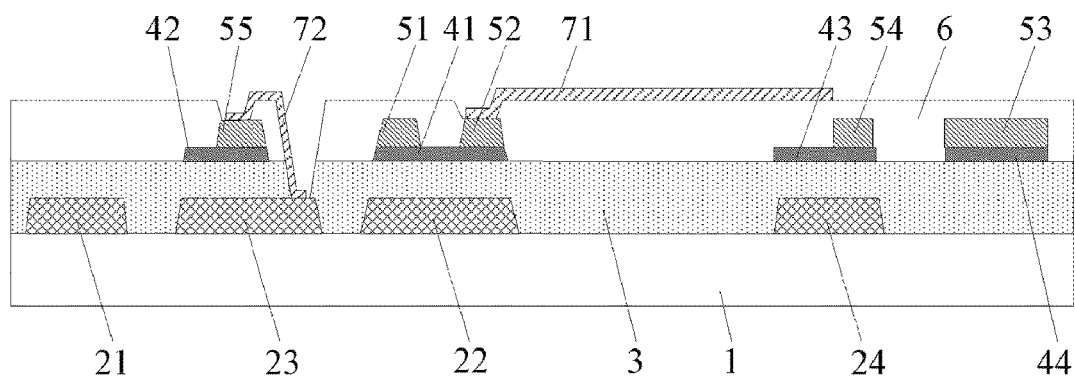
FIG. 1 is a cross sectional diagram schematically illustrating the structure of an array substrate according to an embodiment of the present disclosure.

Embodiments of the present disclosure are described in detail with reference to the drawings. It is to be noted that like or similar reference numerals throughout indicate like or similar elements or elements having like or similar functions. The embodiments described hereinafter in connection with the drawings are exemplary; they are only used for illustrating the present disclosure, and should not be construed as limiting the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a cross sectional diagram schematically illustrating the structure of an array substrate according to an embodiment of the present disclosure. The array substrate includes a base substrate 1 and a gate metal layer, a semiconductor layer, a source-drain metal layer and a pixel electrode layer that are formed on the base substrate 1.

The gate metal layer includes gate lines 21 and gate electrodes 22 of thin film transistors. The source-drain metal layer includes data lines 53, and source electrodes 51 and drain electrodes 52 of the thin film transistors. The semiconductor layer includes an active layer 41 of the thin film transistors.

The array substrate further includes a plurality of first sensing lines 23 formed in the gate metal layer and extending along a row direction, a plurality of first photosensitive elements 42 and second photosensitive elements 43 formed in the semiconductor layer and being insulated from each other, a plurality of second sensing lines 54 formed in the source-drain metal layer and extending along a column direction, and shielding electrodes 24 formed in the gate metal layer.

Figure 2:
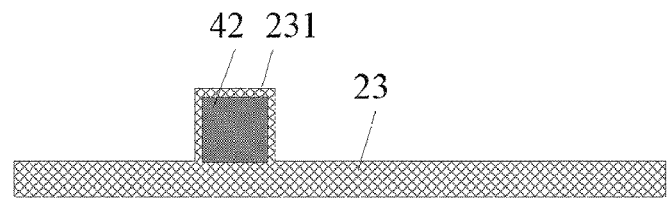
FIG. 2 is a plan view schematically illustrating the arrangement of the first sensing line and the first photosensitive element in an array substrate according to an embodiment of the present disclosure.

The shielding electrodes 24 are located under the second photosensitive elements 43 to shield the second photosensitive elements 43 from the backlight that comes from below the array substrate. This can avoid the situation in which the second photosensitive elements 43 are always illuminated by the backlight and thus cannot sense a touch. For the first photosensitive elements 42, the first sensing lines 23 can be used to shield them. As is shown in FIG. 2, the first sensing line 23 may be provided with an extension part 231, by which the first photosensitive element 42 is shielded. In this example, the extension part 231 is a section of the first sensing line 23 that is extended in a width direction. The area of the extension part 231 is larger than that of the first photosensitive element 42 such that the first photosensitive element 42 is shielded from the backlight coming from below the array substrate.

In the example as shown in FIG. 1, the array substrate further includes a gate insulation layer 3 arranged between the gate metal layer and the semiconductor layer. The gate insulation layer 3 provides insulation between the gate metal layer and the semiconductor layer.

Figure 3:
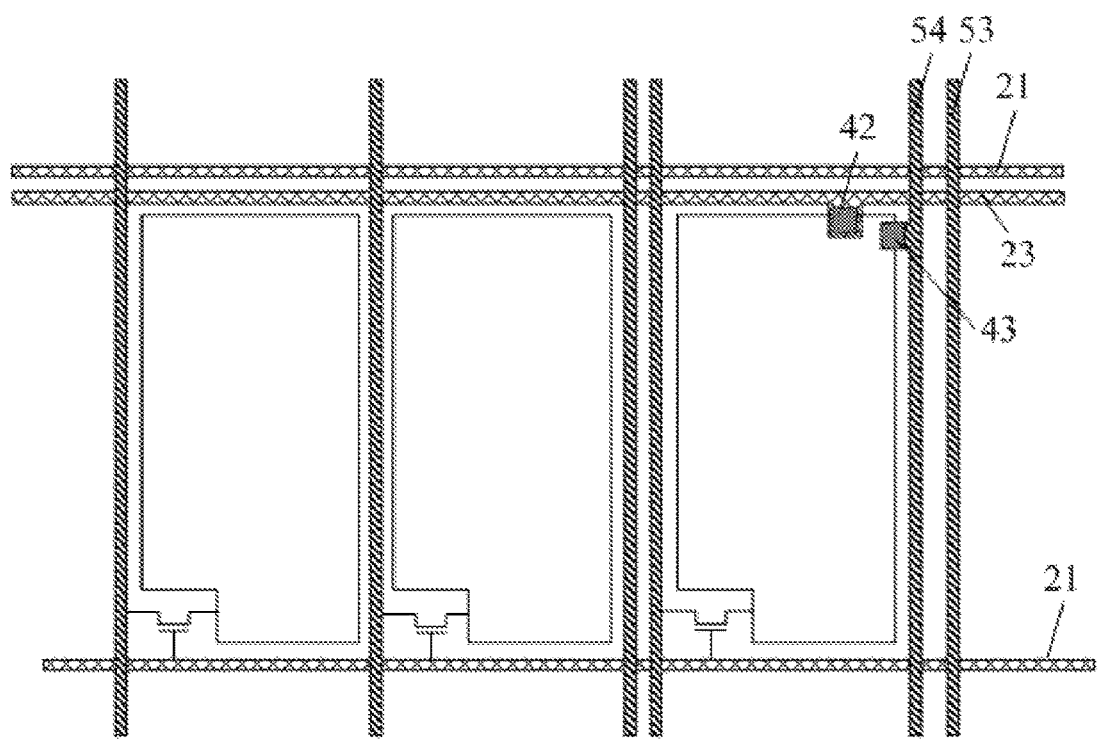
FIG. 3 is a structural schematic diagram illustrating a portion of an array substrate according to an embodiment of the present disclosure.

FIG. 3 is a structural schematic diagram illustrating a portion of an array substrate according to an embodiment of the present disclosure. Although only one first photosensitive element 42 and one second photosensitive element 43 are shown in FIG. 3, it should be understood that the array substrate includes a plurality of first photosensitive elements 42 and a plurality of second photosensitive elements 43. The plurality of first photosensitive elements 42 are arranged in an array and the first photosensitive elements 42 of the same row are electrically connected to a corresponding one of the plurality of first sensing lines 23. The plurality of second photosensitive elements 43 are arranged in an array and the second photosensitive elements 43 of the same column are electrically connected to a corresponding one of the plurality of second sensing lines 54.

The first photosensitive elements 42 and the second photosensitive elements 43 generate current signals in response to ambient light, and the first sensing lines 23 and the second sensing lines 54 transfer the current signals generated by the first photosensitive elements 42 and the second photosensitive elements 43 to an external circuit (not shown), respectively, for detection of a touch position. In this example, the first photosensitive elements 42 and the second photosensitive elements 43 are formed by noncrystalline silicon material, which is the same material as the active layer 41 of the thin film transistors. When being illuminated by the ambient light, the first photosensitive elements 42 and the second photosensitive elements 43 generate the current signals (photo-induced carriers).

When the first photosensitive elements 42 and the second photosensitive elements 43 are shielded by a finger or a stylus (namely, the finger or the stylus touches an optical touch screen in which the array substrate is applied), the intensity of the ambient light received by the first photosensitive elements 42 and the second photosensitive elements 43 will change, leading to a change in the generated current signals. As such, the touch position of the finger or the stylus can be determined from the change in the current signals that are transferred by the first sensing lines 23 connected to the first photosensitive elements 42 and the second sensing lines 54 connected to the second photosensitive elements 43.

In some scenarios, the finger or the stylus does not touch the optical touch screen but only approaches it, in which case because of diffuse reflection, the ambient light will still illuminate the first photosensitive elements 42 and the second photosensitive elements 43. The generated current signals however may change to such a small extent that the touch position cannot be determined. As such, the optical touch screen applying the array substrate as described above in some embodiments is used as a contact optical touch screen. The advantage is that misjudgment resulting from the weak change in the ambient light can be avoided.

Referring back to FIG. 1, in some embodiments, the array substrate further includes connection electrodes 72 that are formed in the pixel electrode layer. Namely, the connection electrodes 72 and the pixel electrodes 71 are arranged in the same layer. The connection electrode 72 provides electrical connection between the first sensing line 23 and the first photosensitive element 42. As the connection electrodes 72 are formed in the pixel electrode layer, no additional layer is needed, thus simplifying the fabricate process.

In some embodiments, the array substrate further includes transition electrodes 55 that are formed in the source-drain metal layer. The connection electrodes 72 are connected to the first photosensitive elements 42 through the transition electrodes 55. As the transition electrodes 55 are formed in the source-drain metal layer, no additional layer is needed, thus simplifying the fabricate process.

Since the first sensing lines 23 and the first photosensitive elements 42 are located at different layers (with the first sensing lines 23 located at the gate metal layer, and the first photosensitive elements 42 at the semiconductor layer), the electrical connection between the first sensing lines 23 and the first photosensitive elements 42 can be done with vias. In some embodiments, the connection electrode 72 connects the first sensing line 23 to the transition electrode 55 through one or more vias. The arrangement of the vias is described below.

In some embodiments, the first sensing lines 23 are parallel to the gate lines 21, and the second sensing lines 54 are parallel to the data lines 53. The gate lines 21 and the data lines 53 intersect each other to define a plurality of pixel units. One first photosensitive element 42 and one second photosensitive element 43 form a photosensitive element group. In some embodiment, each photosensitive element group corresponds to a respective pixel unit. In other embodiments, each photosensitive element group corresponds to a plurality of pixel units. For example, for an optical touch screen that requires high touch control accuracy, the number of the photosensitive element groups may be equal to the number of the pixel units. That is, each photosensitive element group corresponds to a respective pixel unit. The pixel unit may be an R, or B sub-pixel, or a pixel unit including an R, G and B sub-pixel. For another example, for an optical touch screen that requires low touch control accuracy, the number of the photosensitive element groups may be less than the number of the pixel units. Namely, each photosensitive element group corresponds to a plurality of pixel units.

In some embodiments, the semiconductor layer may include a part on which the data lines 53 are formed, which part is denoted as a semiconductor reserve layer 44. The semiconductor reserve layer 44 may provide anti-oxidation protection for the data lines 53, or prevent the data lines 53 from being eroded by the etchants when conducting etching. In addition, the procedures may be reduced by not removing this semiconductor reserve layer 44.

As described above, the array substrate can be applied in an optical touch screen. In general, the optical touch screen further includes a color filter substrate that is cell-aligned with the array substrate. The color filter substrate may include black matrice. In some embodiments, when viewed from a thickness direction of the optical touch screen, the black matrice do not overlap the first photosensitive elements 42 and the second photosensitive elements 43. That is, the black matrice do not shield the first photosensitive elements 42 and the second photosensitive elements 43, such that the first photosensitive elements 42 and the second photosensitive elements 43 can sense the change in the ambient light.

Further, the optical touch screen may form a part of a display device.

Figure 4:
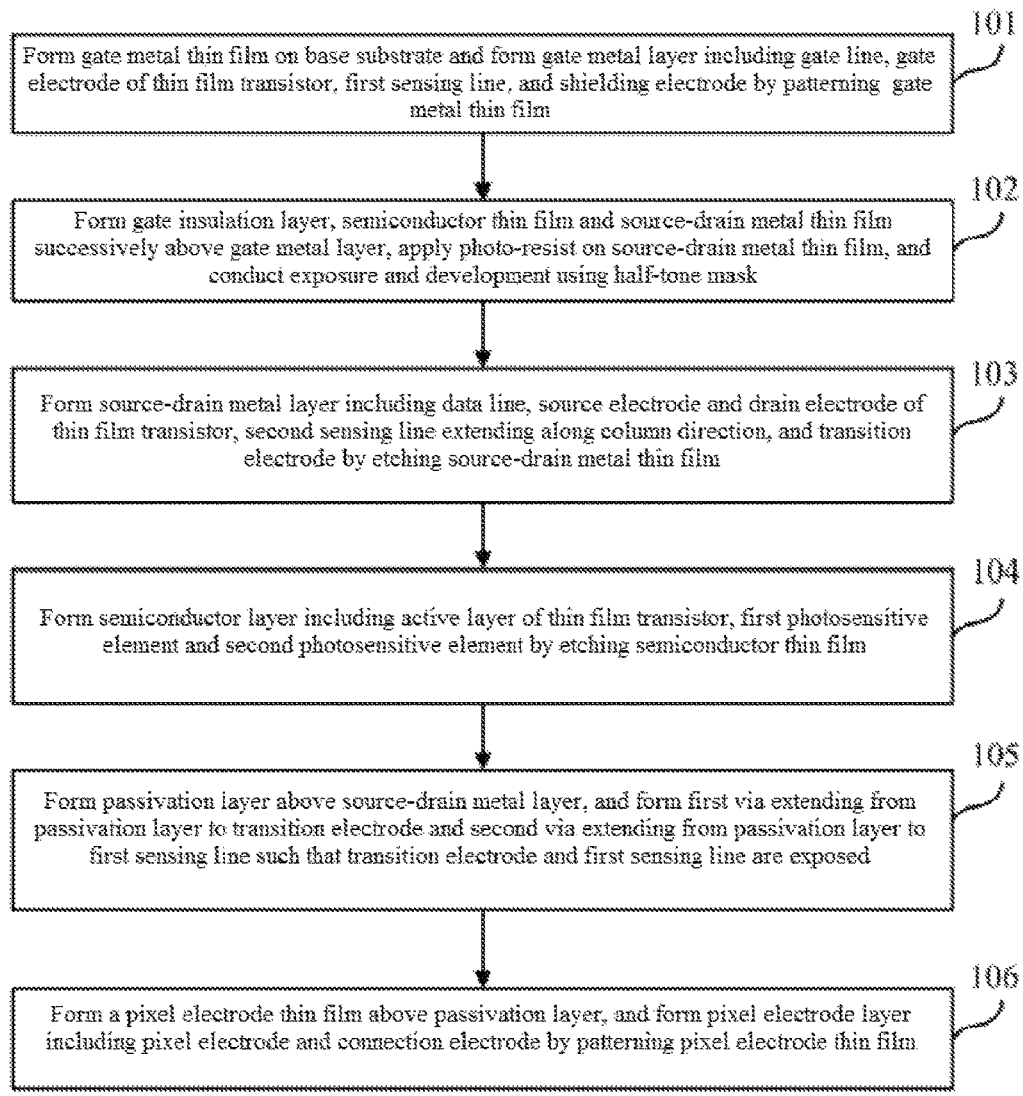
FIG. 4 is a flow chart of a method of fabricating an array substrate according to an embodiment of the present disclosure.

FIG. 4 is a flow chart of a method of fabricating an array substrate according to an embodiment of the present disclosure. The method includes the following steps.

At step 101, a gate metal thin film is formed on a base substrate, and a gate metal layer including a gate line, a gate electrode of a thin film transistor, a first sensing line, and a shielding electrode is formed by patterning the gate metal thin film.

At step 102, a gate insulation layer, a semiconductor thin film and a source-drain metal thin film are formed successively above the gate metal layer, then photo-resist is applied on the source-drain metal thin film, and then exposure and development are conducted using a half-tone mask.

At step 103, a source-drain metal layer including a data line, a source electrode and a drain electrode of the thin film transistor, a second sensing line extending along a column direction, and a transition electrode is formed by etching the source-drain metal thin film.

At step 104, a semiconductor layer including an active layer of the thin film transistor, a first photosensitive element and a second photosensitive element is formed by etching the semiconductor thin film. The first photosensitive element is located under and in contact with the transition electrode, and the second photosensitive element is located under and in contact with the second sensing line.

At step 105, a passivation layer is formed above the source-drain metal layer, and a first via extending from the passivation layer to the transition electrode and a second via extending from the passivation layer to the first sensing line are formed such that the transition electrode and the first sensing line are exposed.

At step 106, a pixel electrode thin film is formed above the passivation layer, and a pixel electrode layer including a pixel electrode and a connection electrode is formed by patterning the pixel electrode thin film.

The individual steps of the method as shown in FIG. 4 are described in detail in connection with FIGS. 5 to 8.

Figure 5:
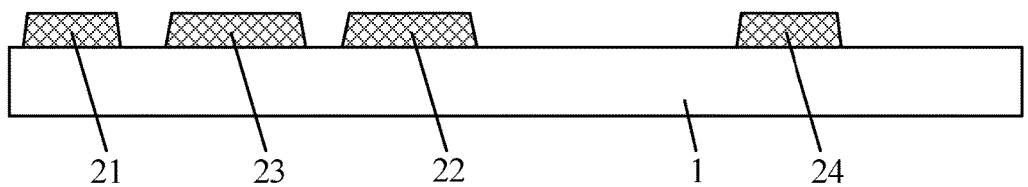
FIGS. 5 to 8 are cross sectional diagrams schematically illustrating the structure of a resulting array substrate from the individual steps of the method as shown in FIG. 4, respectively.

Referring to FIG. 5, a gate metal thin film is formed on a base substrate 1, and a gate metal layer including a gate line 21, a gate electrode 22 of a thin film transistor, a first sensing line 23, and a shielding electrode 24 is formed by patterning the gate metal thin film.

Figure 6:
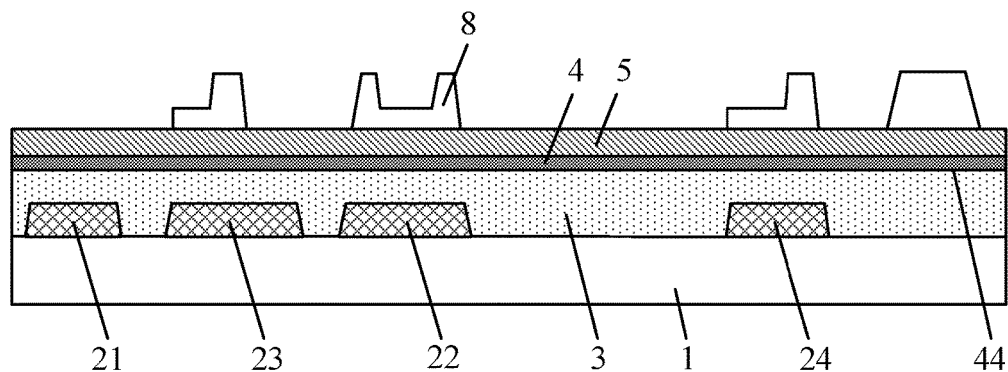

Referring to FIG. 6, a gate insulation layer 3, a semiconductor thin film 4 and a source-drain metal thin film 5 are formed successively above the gate metal layer, then photo-resist 8 is applied on the source-drain metal thin film 5, and then exposure and development are conducted using a half-tone mask. The half-tone mask is known in the art, and thus is not discussed here in detail.

Figure 7:
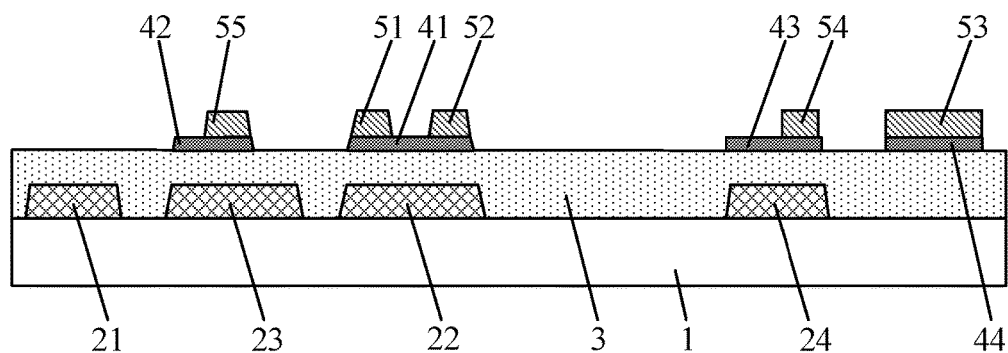

Referring to FIG. 7, a source-drain metal layer including a data line 53, a source electrode 51 and a drain electrode 52 of the thin film transistor, a second sensing line 54 extending along a column direction, and a transition electrode 55 is formed by etching the source-drain metal thin film. A semiconductor layer including an active layer 41 of the thin film transistor, a first photosensitive element 42 and a second photosensitive element 43 is formed by etching the semiconductor thin film 4. The first photosensitive element 42 is located under and in contact with the transition electrode 55, and the second photosensitive element 43 is located under and in contact with the second sensing line 54. The etching process is known in the art. In an embodiment, the etching process may be dry etching or wet etching.

Figure 8:
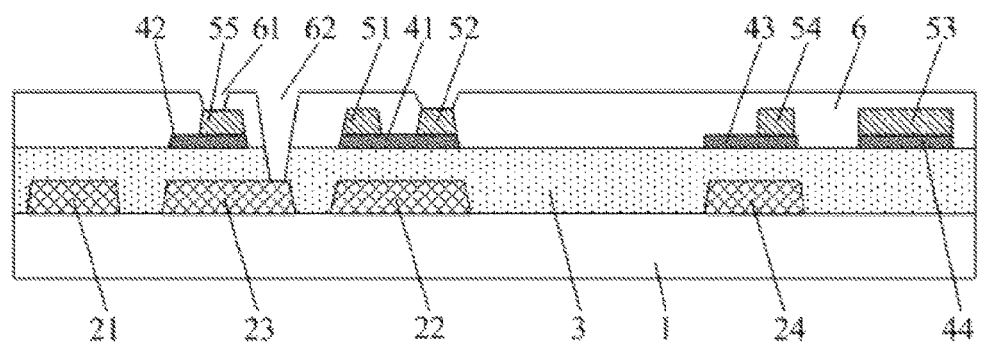

Referring to FIG. 8, a passivation layer 6 is formed above the source-drain metal layer, and a first via 61 extending from the passivation layer 6 to the transition electrode 55 and a second via 62 extending from the passivation layer 6 to the first sensing line 23 are formed such that the transition electrode 55 and the first sensing line 23 are exposed.

Referring back to FIG. 1, a pixel electrode thin film is formed above the passivation layer 6, and a pixel electrode layer including a pixel electrode 71 and a connection electrode 72 is formed by patterning the pixel electrode thin film.

In some embodiments, before the pixel electrode thin film is formed above the passivation layer 6, a via may be formed which extends from the passivation layer 6 to the drain electrode 52 such that the pixel electrode 71 subsequently formed can be connected to the drain electrode 52. Further, the transition electrode 55 may be connected to the first sensing line 23 using the connection electrode 72.

In embodiments of the present disclosure, as the first photosensitive element, the second photosensitive element, the first sensing line and the second sensing line are formed in the existing layers of the array substrate, no additional layer is needed, thus facilitating simplification of the fabricate process.

While operations are depicted in the drawings in a particular order, this should not be understood as requiring that such operations are to be performed in the particular order shown or in a sequential order, or that all illustrated operations are to be performed to achieve desirable results.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

LISTING OF THE REFERENCE NUMERALS

1—base substrate; 21—gate line; 22—gate electrode; 23—first sensing line; 24—shielding electrode; 3—gate insulation layer; 4—semiconductor thin film; 41—active layer; 42—first photosensitive element; 43—second photosensitive element; 44—semiconductor reserve layer; 5—source-drain metal thin film; 51—source electrode; 52—drain electrode; 53—data line; 54—second sensing line; 55—transition electrode; 6—passivation layer; 61—first via; 62—second via; 71—pixel electrode; 8—photo resist.

What is claimed is:

1. An array substrate comprising:
a base substrate; and
a gate metal layer, a semiconductor layer, a source-drain metal layer, and a pixel electrode layer that are formed on the base substrate, the gate metal layer comprising gate lines, gate electrodes of thin film transistors, and a plurality of first sensing lines extending along a row direction, the semiconductor layer comprising an active layer of the thin film transistors, and a plurality of first photosensitive elements and a plurality of second photosensitive elements insulated from each other, the source-drain metal layer comprising data lines, source electrodes and drain electrodes of the thin film transistors, and a plurality of second sensing lines extending along a column direction;
wherein the plurality of first photosensitive elements are arranged in an array and the first photosensitive elements of a same row are electrically connected to a corresponding one of the plurality of first sensing lines, each of the plurality of first photosensitive elements being configured to generate a current signal responsive to ambient light, and each of the plurality of first sensing lines being configure to transfer current signals generated by a corresponding row of first photosensitive elements;
wherein the plurality of second photosensitive elements are arranged in an array and the second photosensitive elements of a same column are electrically connected to a corresponding one of the plurality of second sensing lines, each of the plurality of second photosensitive elements being configured to generate a current signal responsive to ambient light, each of the plurality of second sensing lines being configure to transfer the current signal generated by a corresponding column of second photosensitive elements;
wherein the gate metal layer further comprises a plurality of shielding electrodes each located under a respective one of the plurality of second photosensitive elements to shield the respective second photosensitive element from illumination by a backlight; and
wherein the plurality of first sensing lines are each provided with an extension part for shielding a respective one of the plurality of first photosensitive elements from illumination by a backlight.

2. The array substrate of claim 1, further comprising a plurality of connection electrodes formed in the pixel electrode layer, wherein each of the connection electrodes provides electrical connection between a corresponding one of the plurality of first sensing lines and a corresponding one of the plurality of first photosensitive elements.

3. The array substrate of claim 2, further comprising a plurality of transition electrodes formed in the source-drain metal layer, wherein each of the transition electrodes connects a respective one of the plurality of connection electrodes to a respective one of the plurality of first photosensitive elements.

4. An optical touch screen comprising the array substrate as recited in claim 3.

5. An optical touch screen comprising the array substrate as recited in claim 2.

6. The array substrate of claim 1, wherein the plurality of first sensing lines are parallel to the gate lines, and wherein the plurality of second sensing lines are parallel to the data lines.

7. The array substrate of claim 6, wherein the gate lines and the data lines intersect each other to define a plurality of pixel units, wherein the plurality of first photosensitive elements and the plurality of second photosensitive elements are divided into a plurality of photosensitive element groups each comprising a respective one of the first photosensitive elements and a respective one of the second photosensitive elements, and wherein each of the photosensitive element groups corresponds to one or more pixel units.

8. An optical touch screen comprising the array substrate as recited in claim 7.

9. An optical touch screen comprising the array substrate as recited in claim 6.

10. The array substrate of claim 1, wherein the extension part is an extended section of the first sensing line in a width direction thereof.

11. The array substrate of claim 1, wherein the semiconductor layer comprises a reserve layer on which the data lines are formed.

12. The array substrate of claim 1, wherein the plurality of first photosensitive elements and the plurality of second photosensitive elements are formed by noncrystalline silicon material.

13. An optical touch screen comprising the array substrate as recited in claim 1.

14. The optical touch screen of claim 13, further comprising a color filter substrate comprising black matrix, wherein when viewed from a thickness direction of the optical touch screen the black matrix does not overlap the plurality of first photosensitive elements and the plurality of second photosensitive elements.

15. A display device comprising the optical touch screen as recited in claim 1.

* * * * *